US009267714B2

(12) United States Patent
Hou et al.

(10) Patent No.: US 9,267,714 B2
(45) Date of Patent: Feb. 23, 2016

(54) THERMOELECTRIC COOLING DEVICE INCLUDING A LIQUID HEAT EXCHANGER DISPOSED BETWEEN AIR HEAT EXCHANGERS

(71) Applicant: B/E AEROSPACE, INC., Wellington, FL (US)

(72) Inventors: Kai S. Hou, Pomona, CA (US); Qiao Lu, Placentia, CA (US); Edward M. Stoebner, Fullerton, CA (US); Patricia Gary, Anaheim, CA (US); William Godecker, Irvine, CA (US); Eric Mickelson, Laguna Niguel, CA (US)

(73) Assignee: B/E AEROSPACE, INC., Wellington, FL (US)

( * ) Notice: Subject to any disclaimer, the term of this patent is extended or adjusted under 35 U.S.C. 154(b) by 170 days.

(21) Appl. No.: 14/070,920

(22) Filed: Nov. 4, 2013

(65) Prior Publication Data
US 2014/0123683 A1    May 8, 2014

Related U.S. Application Data

(60) Provisional application No. 61/724,013, filed on Nov. 8, 2012.

(51) Int. Cl.
*F25B 21/02* (2006.01)
*F28F 3/02* (2006.01)
(Continued)

(52) U.S. Cl.
CPC ............. *F25B 21/02* (2013.01); *B64D 11/04* (2013.01); *F25D 11/00* (2013.01); *F28D 9/0062* (2013.01); *F28F 3/025* (2013.01); *F28F 9/002* (2013.01); *H01L 35/30* (2013.01); *B64D 13/08* (2013.01);
(Continued)

(58) Field of Classification Search
CPC .. F25B 21/00; F25B 2321/0252; F28F 3/025; F28F 8/002; F28F 2275/20; F28F 2275/00; B25D 11/00; B64D 11/04; B64D 13/08; F25D 9/0062; F25D 2021/0021; H01L 35/30; Y02T 50/46
USPC ................................ 62/3.2, 3.6; 165/287, 133
See application file for complete search history.

(56) References Cited

U.S. PATENT DOCUMENTS 3,237,415 A     3/1966  Newton
5,111,878 A  *  5/1992  Kadle ........................... 165/176
(Continued)

OTHER PUBLICATIONS

International Search Report and Written Opinion issued in related application PCT/US2013/068302, Mar. 25, 2014, 12 pages.

*Primary Examiner* — Mohammad M Ali
(74) *Attorney, Agent, or Firm* — Drinker Biddle & Reath LLP

(57) ABSTRACT

A thermoelectric cooling device comprises a liquid heat exchanger, at least two air heat exchangers, and at least two thermoelectric modules. The liquid heat exchanger includes a liquid circulation path through which liquid coolant flows to exchange heat with the liquid heat exchanger. Air flows over each of the air heat exchangers to exchange heat with the respective air heat exchanger. A first thermoelectric module is thermally coupled on a first side with a first side of the liquid heat exchanger and on a second side with a first air heat exchanger to transfer heat between the air heat exchanger and the liquid heat exchanger. A second thermoelectric module is thermally coupled on a first side with a second side of the liquid heat exchanger and on a second side with the second air heat exchanger to transfer heat between the air heat exchanger and the liquid heat exchanger.

22 Claims, 17 Drawing Sheets

(51) Int. Cl.
  *F28F 9/00*     (2006.01)
  *F25D 11/00*    (2006.01)
  *F28D 9/00*     (2006.01)
  *B64D 11/04*    (2006.01)
  *H01L 35/30*    (2006.01)
  *F28D 21/00*    (2006.01)
  *B64D 13/08*    (2006.01)

(52) U.S. Cl.
  CPC . *F25B 2321/0252* (2013.01); *F28D 2021/0021* (2013.01); *F28F 2275/00* (2013.01); *F28F 2275/20* (2013.01); *Y02T 50/46* (2013.01)

(56) References Cited

U.S. PATENT DOCUMENTS

| | | | |
|---|---|---|---|
| 5,561,981 A | 10/1996 | Quisenberry et al. | |
| 5,899,077 A * | 5/1999 | Wright et al. | 62/3.7 |
| 5,937,656 A * | 8/1999 | Cheng et al. | 62/50.2 |
| 6,092,734 A * | 7/2000 | Rea | 237/8 R |
| 6,755,026 B2 * | 6/2004 | Wallach | 62/3.7 |
| 6,782,195 B2 * | 8/2004 | Abras et al. | 392/480 |
| 7,310,953 B2 * | 12/2007 | Pham et al. | 62/3.2 |
| 7,804,686 B2 * | 9/2010 | Parish et al. | 361/696 |
| 7,909,861 B2 * | 3/2011 | Balachandran et al. | 607/104 |
| 8,443,613 B2 * | 5/2013 | Quisenberry et al. | 62/3.61 |
| 9,016,354 B2 * | 4/2015 | Hiraoka et al. | 165/116 |
| 2008/0078185 A1 | 4/2008 | Cao | |
| 2009/0116980 A1 * | 5/2009 | Monjes | 417/410.1 |
| 2010/0071384 A1 | 3/2010 | Lu et al. | |
| 2012/0047911 A1 | 3/2012 | Bhavsar et al. | |
| 2012/0152493 A1 * | 6/2012 | Kao et al. | 165/100 |
| 2012/0312030 A1 | 12/2012 | Lu | |

* cited by examiner

Laminar-flow heat transfer and friction solutions for fully developed velocity and temperature profiles.

| GEOMETRY (L/4r.>100) | $N_{Mu.}$ (H) | $N_{Mu.}$ (T) | $IN_R$ | $\dfrac{N_{Mu.}(H)}{N_{Mu.}(T)}$ | $\dfrac{N_{Mu.}(H)N_{P_T}}{f}$ |
|---|---|---|---|---|---|
| 60° triangle | 3.00 | 2.35 | 13.33 | 1.28 | 0.225 |
| $\dfrac{b}{a} = 1$ (square) | 3.63 | 2.89 | 14.2 | 1.26 | 0.256 |
| ellipse | 4.364 | 3.66 | 16 | 1.19 | 0.273 |
| $\dfrac{b}{a} = 4$ | 5.35 | 4.65 | 18.3 | 1.15 | 0.292 |
| $\dfrac{b}{a} = 8$ | 6.5 | 5.95 | 20.5 | 1.09 | 0.316 |
| $\dfrac{b}{a} = \infty$ | 8.235 | 7.54 | 24 | 1.09 | 0.342 |
| $\dfrac{b}{a} = \infty$ (insulated) | 5.385 | 4.86 | 24 | 1.10 | 0.224 |

FIG. 14

THERMOELECTRIC COOLING DEVICE INCLUDING A LIQUID HEAT EXCHANGER DISPOSED BETWEEN AIR HEAT EXCHANGERS

CROSS-REFERENCE TO RELATED APPLICATION

This application claims the priority benefit of U.S. Provisional Patent Application No. 61/724,013, entitled "Thermoelectric Cooling Device for Aircraft Galley Equipment," and filed on Nov. 8, 2012, the entirety of which is hereby incorporated by reference.

BACKGROUND

Embodiments disclosed herein relate to thermoelectric cooling devices, and more specifically to compact thermoelectric cooling devices for use with aircraft galley equipment.

Thermoelectric devices (TEDs) are used to cool the contents of food and beverage chiller compartments in aircraft galleys. The TEDs, also known as Peltier devices, are solid-state heat pumps that utilize the Peltier effect to move heat from one side of the devices to the other side. Multiple TEDs are sometimes used in parallel to cool the contents of the compartments. In these applications, there is typically a higher weight and size as well as a lower overall efficiency in heat transfer due to the use of the multiple TEDs. In addition, the multiple TEDs typically have different temperatures on their respective cold and/or hot sides from one another, creating an undesired temperature gradient across a single side of the multiple TEDs in parallel.

SUMMARY

Various embodiments of a compact thermoelectric cooling device (TECD) for aircraft galley equipment provide higher efficiency in heat transfer with lower weight and volume than conventional TECDs. In addition, various embodiments comprise multiple thermoelectric devices (TEDs) in parallel to maintain more uniform performance between the individual TEDs. Furthermore, various embodiments comprise TEDs on both sides of a liquid heat exchanger to reduce weight and enhance performance. Various embodiments also comprise thermally conductive fins in air heat exchangers to increase thermal conductance and minimize temperature differences on TEDs thermally coupled with the thermally conductive fins.

According to an embodiment, a thermoelectric cooling device comprises a liquid heat exchanger, at least two air heat exchangers, and at least two thermoelectric modules. The liquid heat exchanger includes a liquid circulation path through which liquid coolant flows to exchange heat with the liquid heat exchanger. Air flows over a first air heat exchanger to exchange heat with the first air heat exchanger, and air flows over a second air heat exchanger to exchange heat with the second air heat exchanger. A first thermoelectric module is thermally coupled on a first side with a first side of the liquid heat exchanger and on a second side with the first air heat exchanger to transfer heat between the first air heat exchanger and the liquid heat exchanger. A second thermoelectric module is thermally coupled on a first side with a second side of the liquid heat exchanger and on a second side with the second air heat exchanger to transfer heat between the second air heat exchanger and the liquid heat exchanger.

The first air heat exchanger may include thermally conductive fins that enhance thermal conductance between the air which flows over the first air heat exchanger and the first air heat exchanger.

The liquid heat exchanger may include a separator that separates the liquid circulation path into an upper circulation path and a lower circulation path. The upper circulation path guides the liquid coolant at a given planar coordinate alongside one side of the separator to flow in one direction and the lower circulation path guides the liquid coolant at the same given planar coordinate alongside the opposite side of the separator to flow in a substantially opposite direction.

The liquid heat exchanger may include an inlet through which the liquid coolant enters the upper circulation path from outside the liquid heat exchanger and an outlet through which the liquid coolant exits the lower circulation path to outside the liquid heat exchanger. The separator may include a hole through which the liquid coolant passes through the separator from the upper circulation path to the lower circulation path.

The upper circulation path may include upper fins adjacent the separator on the one side of the separator, and the lower circulation path may include lower fins adjacent the separator on the opposite side of the separator, wherein the upper fins guide a path of the upper circulation path and the lower fins guide a path of the lower circulation path.

The upper fins and the lower fins may be arranged in a serpentine pattern that guides the liquid coolant in the upper circulation path and the liquid coolant in the lower circulation path to flow in substantially opposite directions from one another along opposite sides of the separator.

The liquid circulation path may be separated into a plurality of pairs of upper circulation paths and lower circulation paths disposed in parallel with one another.

According to another embodiment, a compartment chiller comprises a housing, a chilled compartment disposed within the housing, and a thermoelectric cooling device. The thermoelectric cooling device comprises a liquid heat exchanger, at least two air heat exchangers, and at least two thermoelectric modules. The liquid heat exchanger includes a liquid circulation path through which liquid coolant flows to exchange heat with the liquid heat exchanger. Air flows over a first air heat exchanger to exchange heat with the first air heat exchanger before chilling the chilled compartment, and air flows over a second air heat exchanger to exchange heat with the second air heat exchanger before chilling the chilled compartment. A first thermoelectric module is thermally coupled on a first side with a first side of the liquid heat exchanger and on a second side with the first air heat exchanger to transfer heat between the first air heat exchanger and the liquid heat exchanger. A second thermoelectric module is thermally coupled on a first side with a second side of the liquid heat exchanger and on a second side with the second air heat exchanger to transfer heat between the second air heat exchanger and the liquid heat exchanger.

According to another embodiment, a method of chilling air using the thermoelectric cooling device comprises circulating liquid coolant through the liquid heat exchanger to exchange heat with the liquid heat exchanger to cool the liquid heat exchanger. The method also comprises flowing warm first air over the first air heat exchanger to exchange heat with the first air heat exchanger to cool the first air, and flowing warm second air over the second air heat exchanger to exchange heat with the second air heat exchanger to cool the second air. The method further includes transferring heat between the first air heat exchanger and the liquid heat exchanger to cool the first air heat exchanger, and transferring heat between the second air heat exchanger and the liquid heat exchanger to cool the second air heat exchanger.

The method may further comprise flowing the warm first air over thermally conductive fins that enhance thermal conductance between the warm first air and the first air heat exchanger.

The method may further comprise separating the liquid circulation path into an upper circulation path and a lower circulation path using a separator. The upper circulation path may guide the liquid coolant at a given planar coordinate alongside one side of the separator to flow in one direction and the lower circulation path may guide the liquid coolant at the same given planar coordinate alongside the opposite side of the separator to flow in a substantially opposite direction.

The method may further comprise the liquid coolant entering the upper circulation path from outside the liquid heat exchanger through an inlet, the liquid coolant exiting the lower circulation path to outside the liquid heat exchanger through an outlet, and the liquid coolant passing through the a hole in the separator from the upper circulation path to the lower circulation path.

The method may further comprise guiding the liquid coolant in the upper circulation path and the liquid coolant in the lower circulation path to flow in substantially opposite directions from one another along opposite sides of the separator using upper fins and lower fins arranged in a serpentine pattern.

The method may further include guiding the liquid coolant in a plurality of pairs of upper circulation paths and lower circulation paths disposed in parallel with one another.

BRIEF DESCRIPTION OF THE DRAWINGS

Various embodiments are illustrated in the drawings and described in the following discussion.

FIG. 14 illustrates an increase in heat transfer by applying thermoelectric modules to both sides of a liquid heat exchanger, according to an embodiment.

DETAILED DESCRIPTION

Figure 1:
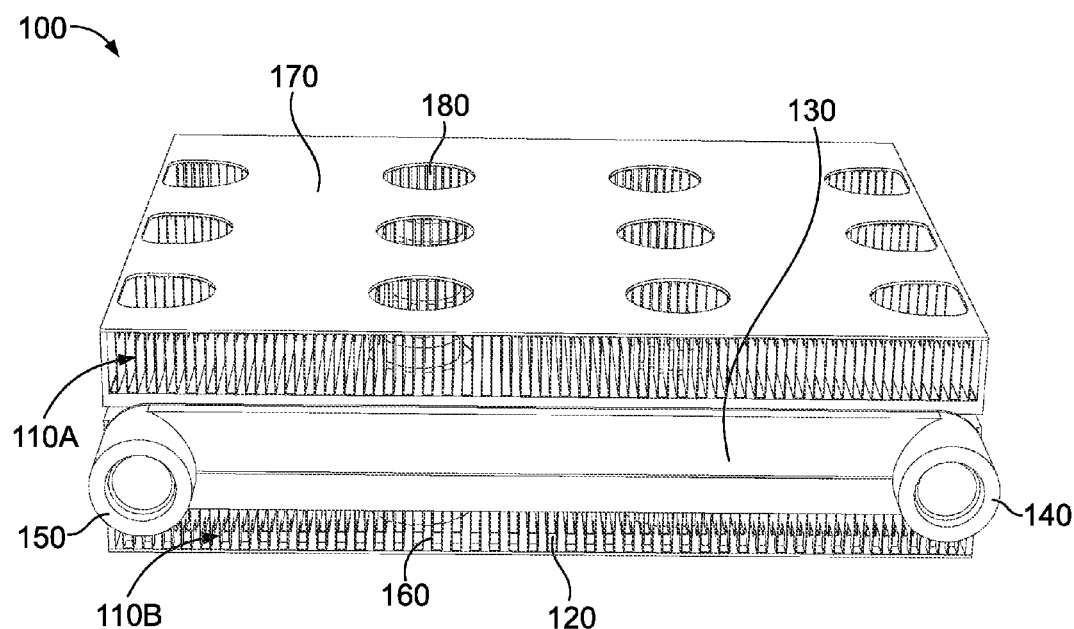
FIG. 1 is a perspective view of a liquid port end of a thermoelectric chiller assembly, according to an embodiment.
Figure 2:
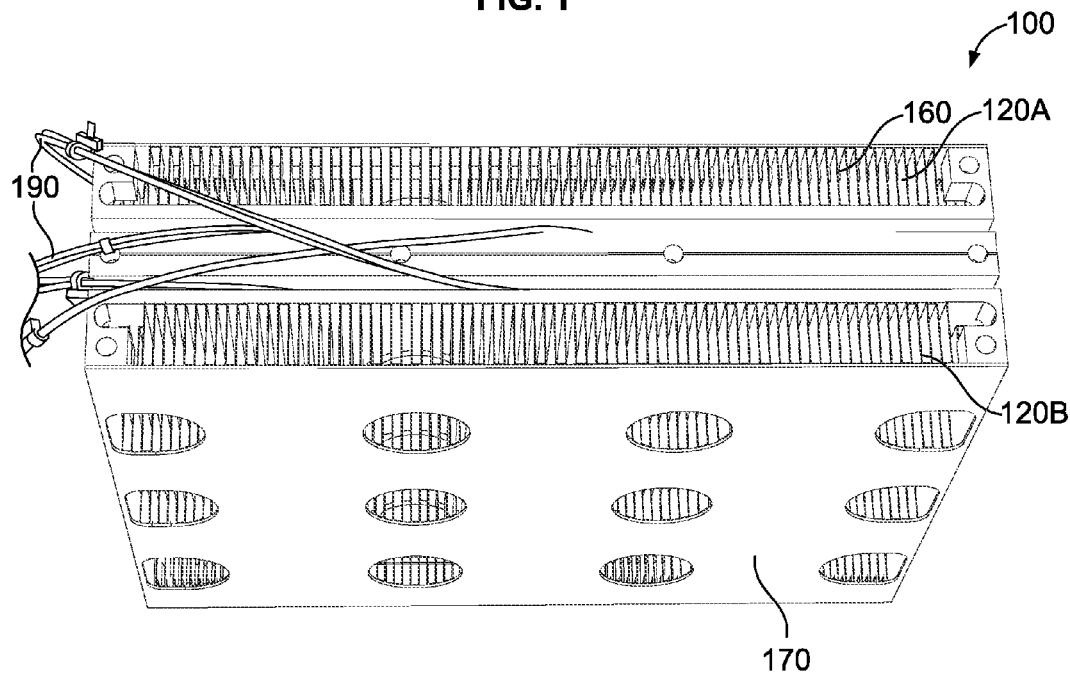
FIG. 2 is a perspective view of an opposite end of the thermoelectric chiller assembly of FIG. 1, according to an embodiment.
Figure 3:
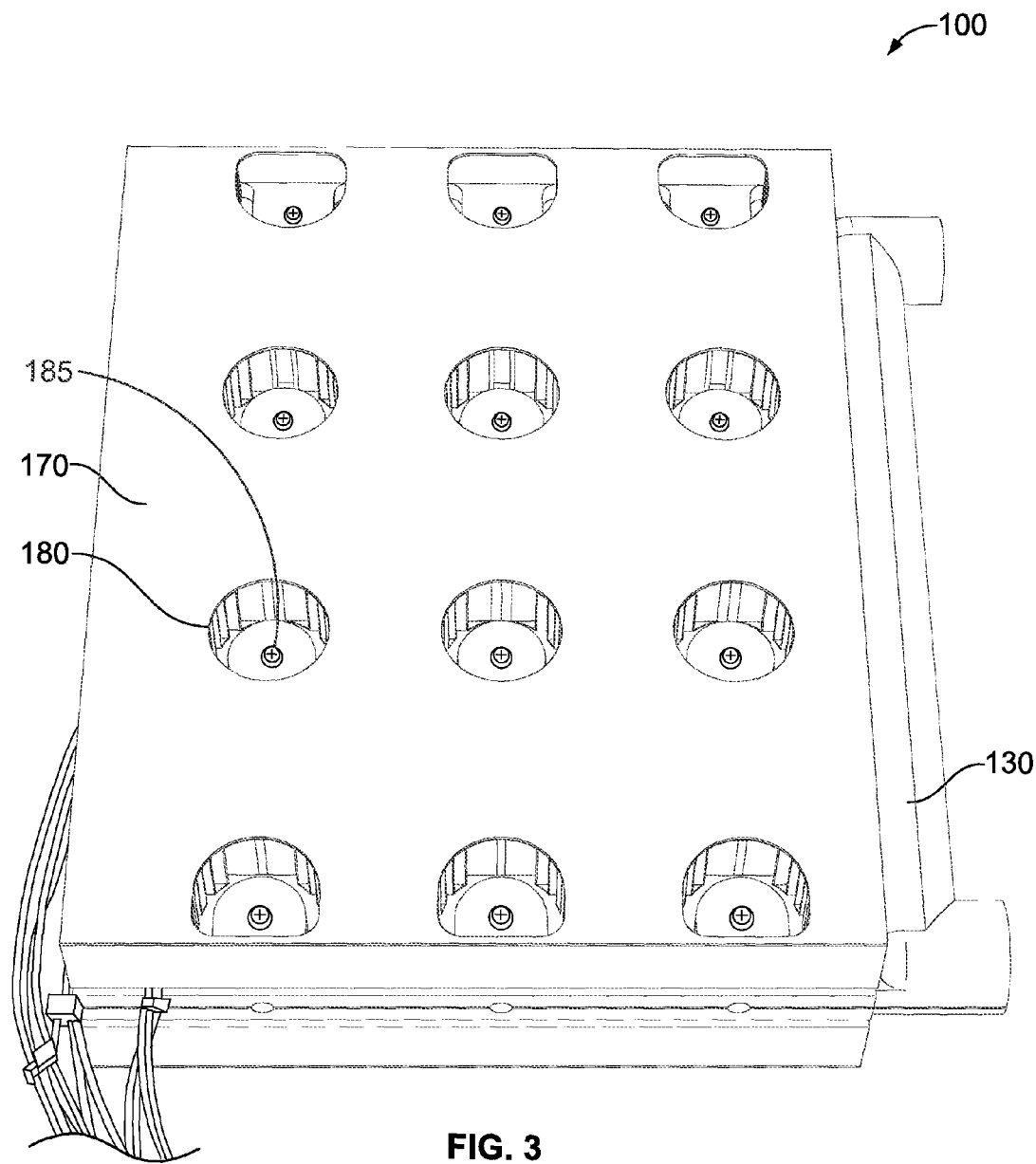
FIG. 3 is a perspective view of a side of the thermoelectric chiller assembly of FIG. 1, according to an embodiment.
Figure 4:
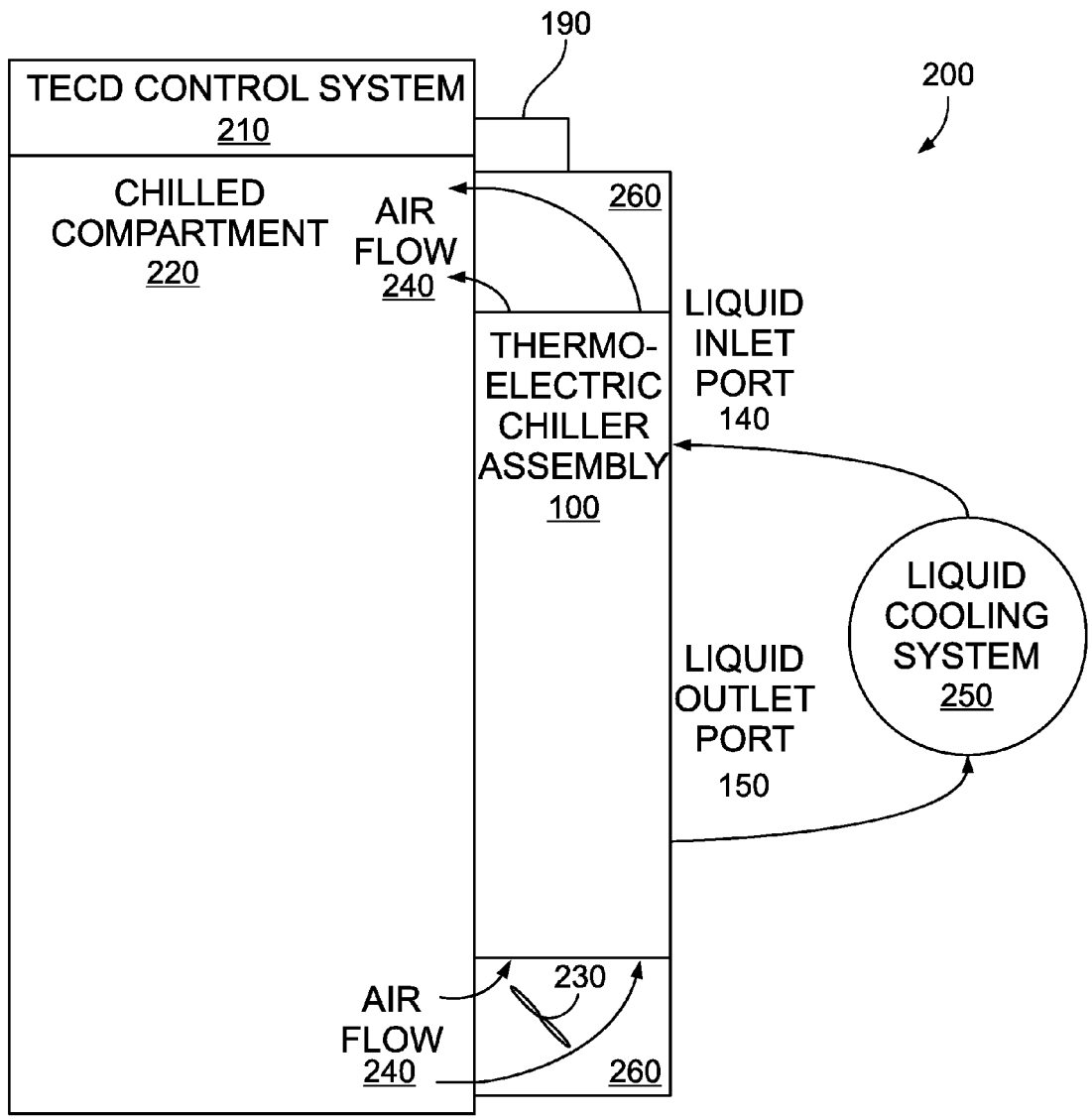
FIG. 4 illustrates an aircraft galley chiller system including an embodiment of the thermoelectric chiller assembly of FIG. 1, according to an embodiment.

FIG. 1 is a perspective view of a liquid port end of a thermoelectric chiller assembly 100, according to an embodiment. FIG. 2 is a perspective view of an opposite end of the thermoelectric chiller assembly 100 of FIG. 1, according to an embodiment. FIG. 3 is a perspective view of a side of the thermoelectric chiller assembly 100 of FIG. 1, according to an embodiment. FIG. 4 illustrates an aircraft galley chiller system 200 including an embodiment of the thermoelectric chiller assembly 100 of FIG. 1, according to an embodiment. While the embodiments described herein refer to applications in an aircraft galley, this should not be construed as limiting. For example, other embodiments may be applied in other vehicles, such as ships, trains, buses, or vans. Furthermore, other embodiments may be applied in non-vehicular applications such as homes and offices.

The thermoelectric chiller assembly 100 is an embodiment of a compact thermoelectric cooling device (TECD) which may be used for any of an aircraft galley tri-mode chiller, beverage chiller, refrigerator, or freezer having a chilled compartment 220. The TECD may cool the contents of the chilled compartment 220 by pumping heat from an interior of the chilled compartment 220 through air heat exchangers 110A and 110B into liquid coolant flowing through liquid heat exchanger 130 from a liquid inlet port 140 to a liquid outlet port 150. The air heat exchangers 110A and 110B include fins 160 through which air flows for transferring heat from the air to the air heat exchangers 110A and 110B. Air flow 240 from the interior of the chilled compartment 220 may enter the thermoelectric chiller assembly 100 through air inlet 120 on one end of the thermoelectric chiller assembly 100 and exit the thermoelectric chiller assembly on an opposite end of the thermoelectric chiller assembly 100. The air inlet 120 may include an air inlet 120A on one side of the liquid heat exchanger 130 and an air inlet 120B on an opposite side of the liquid heat exchanger 130. The air inlet 120A may direct air into contact with the air heat exchanger 110A, while the air inlet 120B may direct air into contact with the air heat exchanger 110B.

The thermoelectric chiller assembly 100 is enclosed by an enclosure 170 having fastening positions 180 corresponding to screws 185 that fasten air heat exchangers 110A and 110B onto the thermoelectric chiller assembly 100. While screws 185 are illustrated in the described embodiments, this should not be construed as limiting. In various embodiments, other fastening elements may be used instead of screws 185. For example, the fastening elements may be rivets, pins, glue, welds, or other fastening elements as known in the art.

The thermoelectric chiller assembly 100 includes a plurality of thermoelectric devices (TEDs) arranged in an array on both sides of the liquid heat exchanger 130 between the liquid heat exchanger 130 and each of the air heat exchangers 110A and 110B. Each of the TEDs is electrically coupled to a TED power line 190. As shown, the TED power lines 190 exit the thermoelectric chiller assembly 100 on an end opposite the end having the liquid inlet port 140 and liquid outlet port 150. This should not be construed as limiting, as in various embodiments, the TED power lines 190 may exit the thermoelectric chiller assembly 100 from other ends or sides. The TED power lines 190 may be electrically connected with a TECD control system 210 that powers and electrically controls the TEDs of the thermoelectric chiller assembly 100 to cool the contents of the chilled compartment 220.

When the TECD is used to cool an interior of an aircraft galley tri-mode chiller, beverage chiller, refrigerator, or freezer having the chilled compartment 220, heat from the contents of the chilled compartment 220 such as food and beverages, as well as other heat from the environment outside of the enclosure 170, are transferred from the air heat exchangers 110A and 110B to liquid coolant flowing through the liquid heat exchanger 130 by the TEDs disposed in an array on both sides of the liquid heat exchanger 130. The TEDs also transfer heat generated by operation of the TEDs to the liquid coolant flowing through the liquid heat exchanger 130. A recirculation fan 230 may be installed on an end or sides of the thermoelectric chiller assembly 100 to circulate air flow 240 as return air from the chilled compartment 220 to the thermoelectric chiller assembly 100 to chill the air flow 240 and then back to the chilled compartment 220 via a chill air path as chilled air flow 240. The air flow 240 may flow through ducts 260 between the chilled compartment 220 and the thermoelectric chiller assembly 100. While the recirculation fan 230 is shown in the return air path in FIG. 4, this should not be construed as limiting, as the recirculation fan 230 could alternatively or additionally be installed in the chill air path. The recirculation fan 230 may also be controlled by the TECD control system 210. In addition, sensors including temperature sensors, liquid coolant flow sensors, and/or airflow sensors may be placed in the chilled compartment 220, the thermoelectric chiller assembly 100, or in the path of air flow 240 for the TECD control system 210 to control the temperature and airflow of the aircraft galley chiller system 200.

The thermoelectric chiller assembly 100 may be coupled with an aircraft's central liquid cooling system (LCS) 250. The liquid coolant flowing through the liquid heat exchanger 130 may be chilled by a central liquid coolant chiller in the aircraft and circulated throughout the aircraft by a central liquid coolant re-circulator. The liquid coolant flowing through the liquid heat exchanger 130 may include a solution such as glycol and water (PGW), GALDEN® fluid, or other heat transfer fluids as known in the art.

A TED includes a solid-state Peltier device that uses the Peltier effect to transfer heat from one side of the TED (i.e., the cold side) to another side of the TED (i.e., the hot side). An example of a TED is an exemplary device as described by TELLUREX (www.tellurex.com/technology/design-manual.php, accessed Jun. 7, 2011). Passing a current through a TED causes heat to transfer from one side to the other, typically producing a temperature differential of around 40 degrees C. The TED can thus be used to transfer heat from a heat exchanger such as the air heat exchangers 110A and 110B on the cold side to a heat sink such as the liquid heat exchanger 130 on the hot side of the TED.

A Peltier device operates by a difference in the Fermi level between two conductors that are placed in electrical contact with one another. Electrons flow out of the conductor in which the electrons are less bound into the conductor in which the electrons are more bound. The Fermi level represents the demarcation in energy within the conduction band of a conductor such as a metal, between the energy levels occupied by electrons and those that are unoccupied. When two conductors with different Fermi levels make contact, electrons flow from the conductor with the higher Fermi level until the change in electrostatic potential brings the two Fermi levels to the same value. This electrostatic potential is known as the contact potential. Electrical current passing across the junction between the two conductors results in either a forward or a reverse bias, resulting in a temperature gradient. If the temperature of the hotter junction (known as the heat sink) is kept low by removing the generated heat, the temperature of the colder junction (known as the cold plate) can be cooled by tens of degrees.

Because the thermoelectric chiller assembly 100 has an air heat exchanger 110A on one side of the liquid heat exchanger 130 and another air heat exchanger 110B on the opposite side of the liquid heat exchanger 130, with TEDs disposed in an array in between both air heat exchangers 110A and 110B and the liquid heat exchanger 130, the thermoelectric chiller assembly 100 transfers heat more efficiently with lower weight and volume than conventional thermoelectric device-based chillers having a heat exchanger on just one side of a single TED or array of TEDs where a heat exchanger only thermally couples with the TEDs on one side.

Figure 5A:
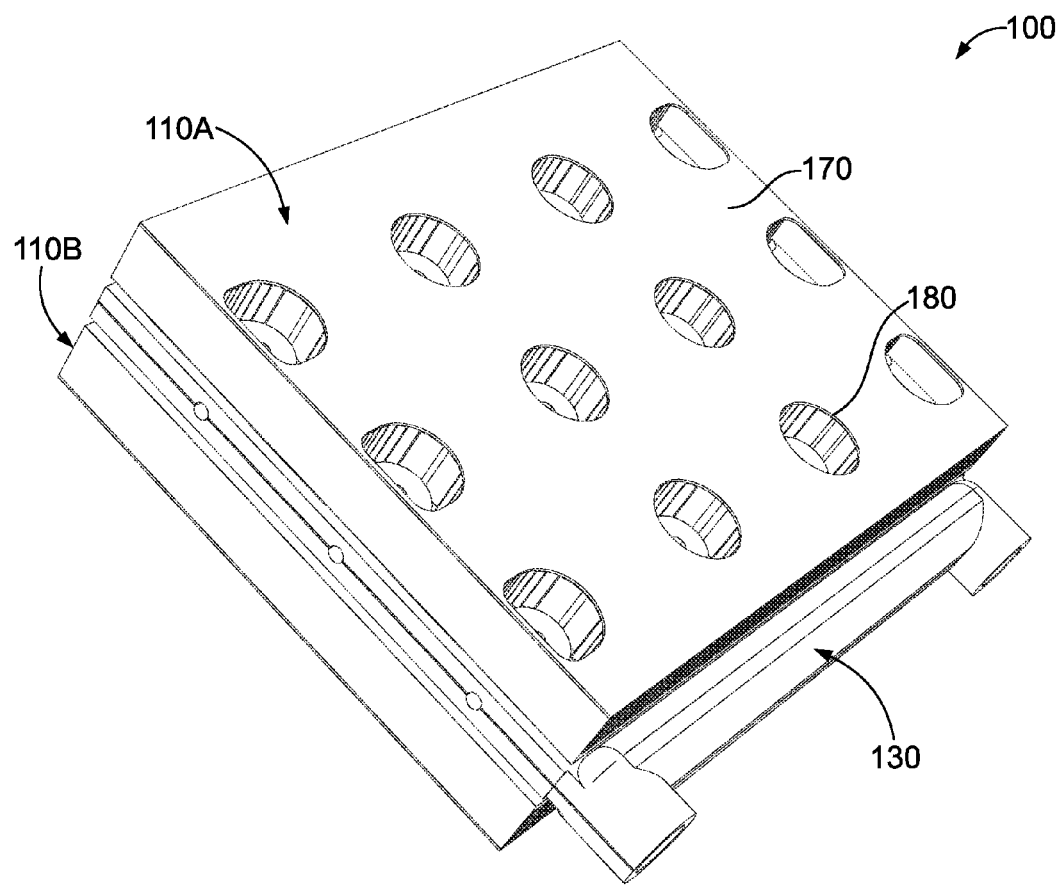
FIGS. 5A and 5B are perspective views of an exterior design of the thermoelectric chiller assembly of FIG. 1, according to an embodiment.
Figure 5B:
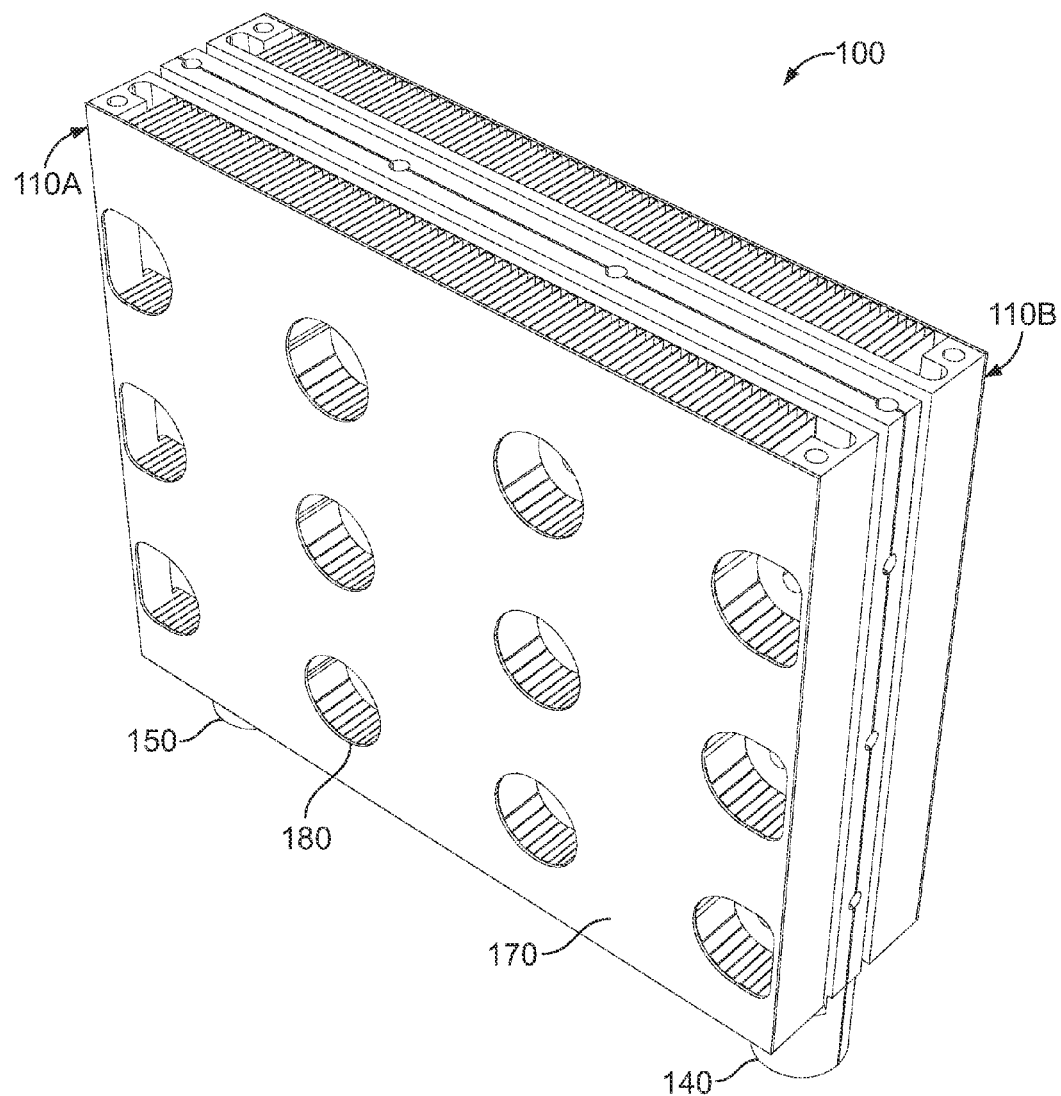

FIGS. 5A and 5B are perspective views of an exterior design of the thermoelectric chiller assembly 100, according to an embodiment. FIGS. 5A and 5B illustrate the liquid heat exchanger 130 sandwiched between the air heat exchanger 110A and the air heat exchanger 110B.

Figure 6:
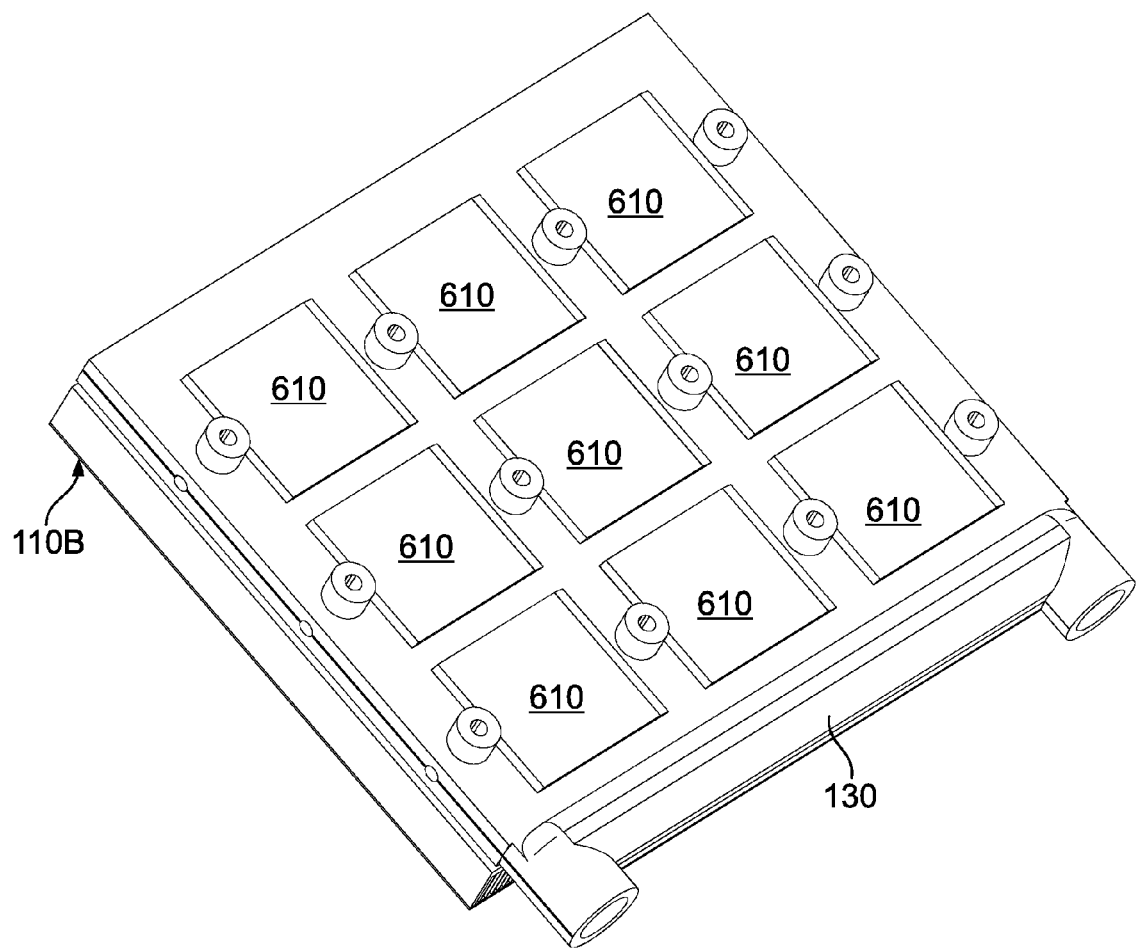
FIG. 6 is a perspective view of thermoelectric modules mounted on a liquid heat exchanger of the thermoelectric chiller assembly of FIG. 5, according to an embodiment.

FIG. 6 is a perspective view of thermoelectric modules 610 mounted on the liquid heat exchanger 130 of the thermoelectric chiller assembly 100 of FIG. 5, according to an embodiment. As illustrated in FIG. 6, an array of nine thermoelectric modules 610 are disposed on each side of the liquid heat exchanger 130 and sandwiched between the liquid heat exchanger 130 and the air heat exchangers 110A and 110B. The thermoelectric modules 610 include the TEDs electrically coupled to the TED power lines 190. While nine thermoelectric modules 610 are illustrated in FIG. 6, this should not be construed as limiting. In various embodiments, more or fewer thermoelectric modules 610 may be disposed on each side of the liquid heat exchanger 130.

Figure 7A:
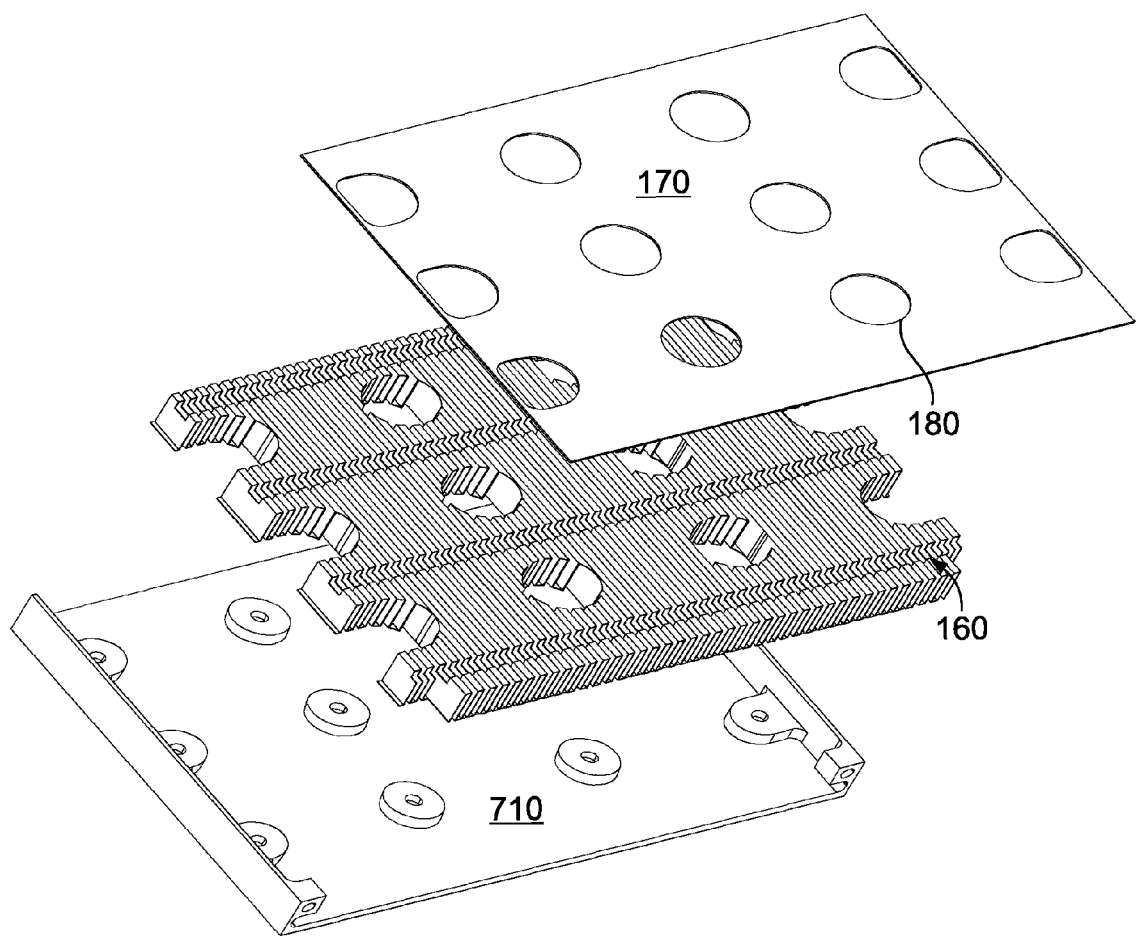
FIGS. 7A and 7B are perspective views of air heat exchanger internal components of the thermoelectric chiller assembly of FIG. 5, according to an embodiment.
Figure 7B:
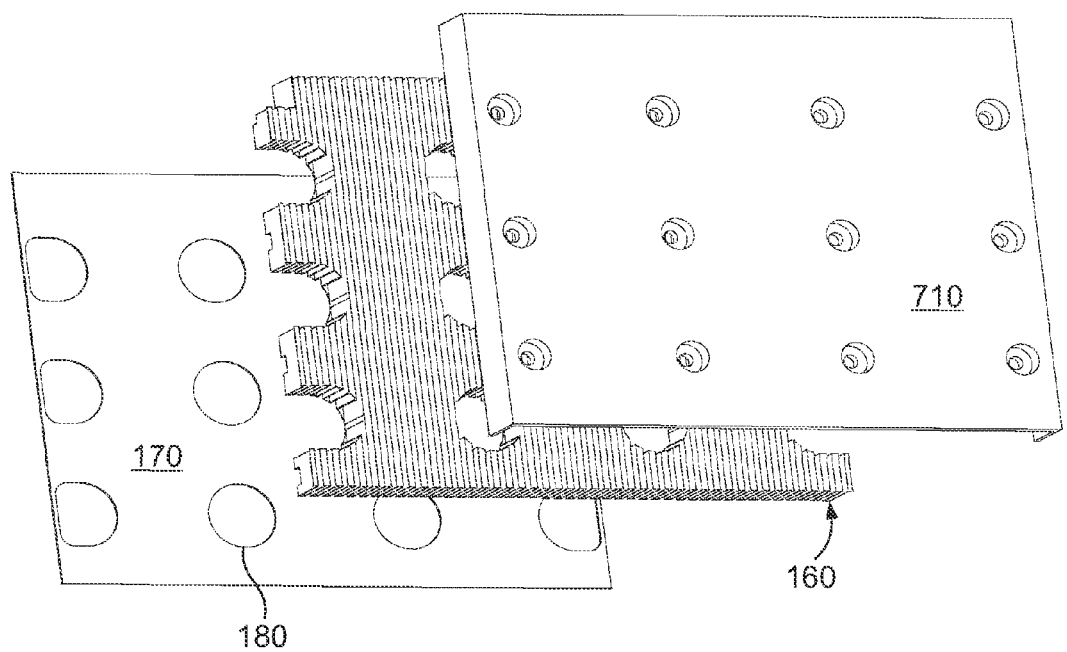

FIGS. 7A and 7B are perspective views of air heat exchanger internal components of the thermoelectric chiller assembly 100 of FIG. 5, according to an embodiment. The components of each of the air heat exchangers 110A and 110B include the enclosure 170 having holes at fastening positions 180, fins 160 that enhance heat transfer between air flowing through the air heat exchanger 110A and 110B, and an air heat exchanger base 710 to which the fins 160 and the enclosure 170 are attached. The air heat exchanger base 710 has holes at the fastening positions 180 for screws 185 to fasten the air heat exchanger base 710 to the liquid heat exchanger 130 with the thermoelectric modules 610 sandwiched therebetween.

Figure 8:
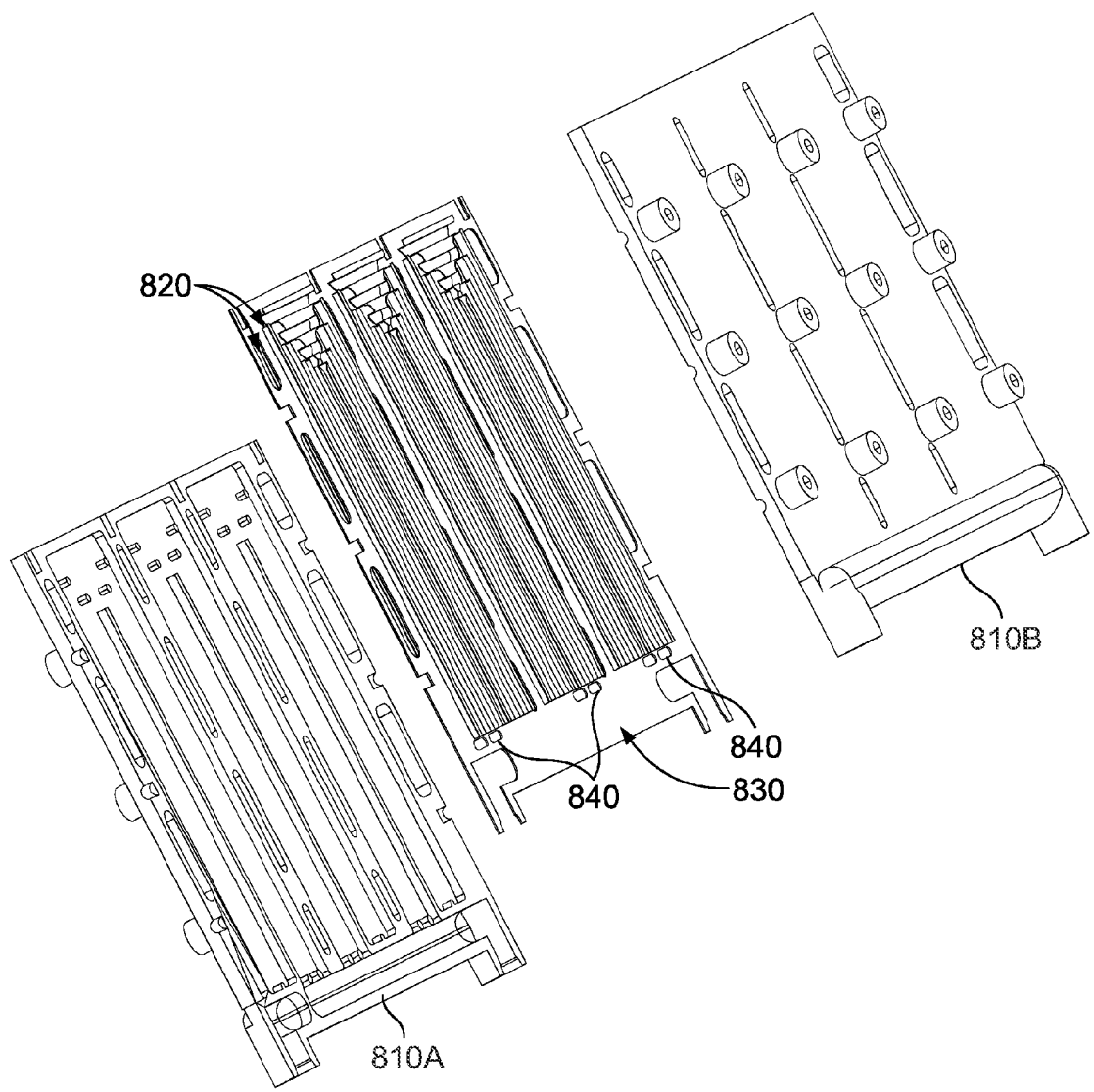
FIG. 8 is a perspective view of liquid heat exchanger internal components of the thermoelectric chiller assembly of FIG. 5, according to an embodiment.

FIG. 8 is a perspective view of liquid heat exchanger internal components of the thermoelectric chiller assembly 100 of FIG. 5, according to an embodiment. The liquid heat exchanger internal components include liquid heat exchanger enclosures 810A and 810B that fasten to the air heat exchangers 110A and 110B, respectively, using screws 185. Between the liquid heat exchanger enclosures 810A and 810B is disposed two layers of fins 820 and a separator 830 disposed between the two layers of fins 820. The separator 830 has holes 840 disposed at the ends of the sets of fins 820 to facilitate liquid flowing from an output of the fins 820 on one side of the separator 830 to an input of the corresponding fins 820 on the other side of the separator 830. The separator 830 thus separates the liquid circulation path in the liquid heat exchanger 130 into an upper circulation path on the side of the liquid heat exchanger enclosure 810A and a lower circulation path on the side of the liquid heat exchanger enclosure 810B. The upper fins 820 on the upper side of the separator 830 guide a path of the upper circulation path, and the lower fins 820 on the lower side of the separator 830 guide a path of the lower circulation path. This is discussed further in relation to the subsequent figures.

Figure 9:
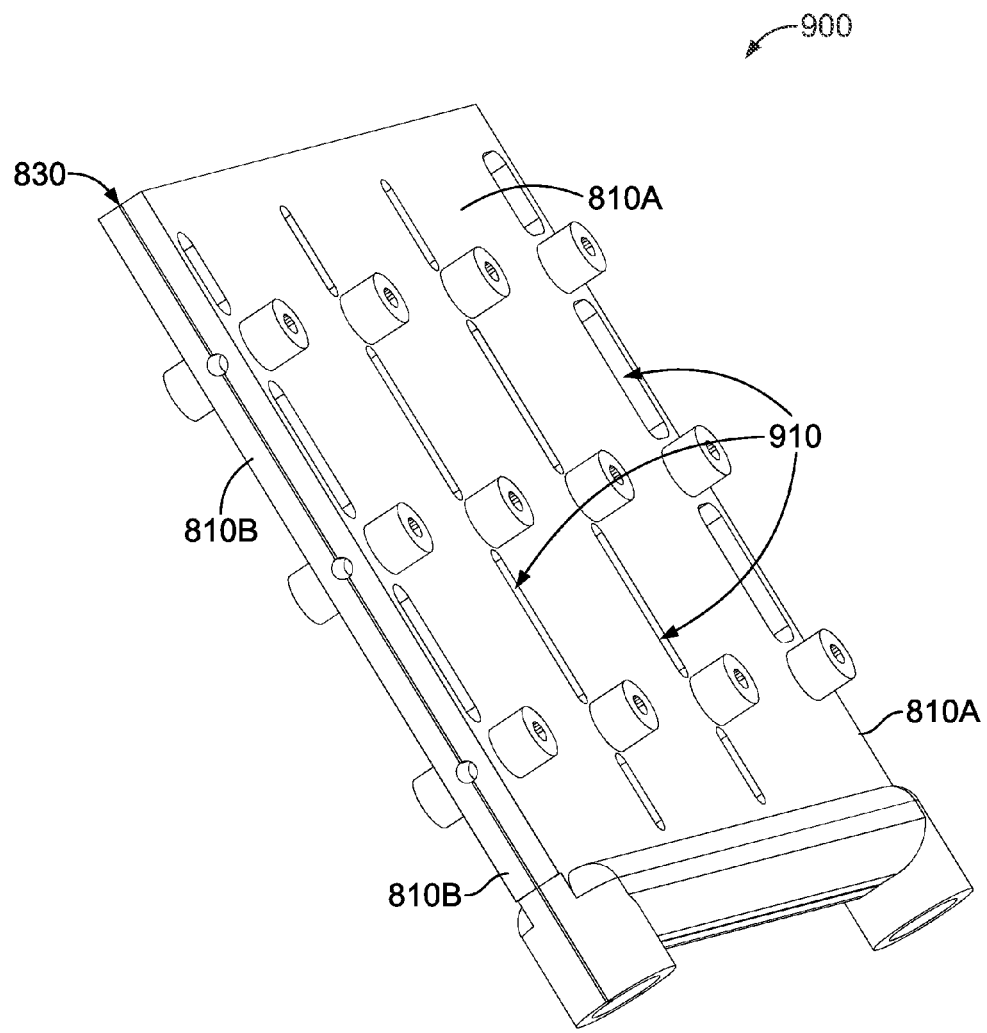
FIG. 9 is a perspective view of a liquid heat exchanger braze assembly of the thermoelectric chiller assembly of FIG. 5, according to an embodiment.

FIG. 9 is a perspective view of a liquid heat exchanger braze assembly 900 of the thermoelectric chiller assembly of FIG. 5, according to an embodiment. The liquid heat exchanger braze assembly 900 comprises the two liquid heat exchanger enclosures 810A and 810B with the separator 830 disposed therebetween. The two liquid heat exchanger enclosures 810A and 810B and separator 830 have corresponding air flow balance ports 910 that facilitate air flow through the liquid heat exchanger braze assembly 900 between the outsides of the two liquid heat exchanger enclosures 810A and 810B facing the air heat exchanger 110A and the air heat exchanger 110B, respectively.

Figure 10:
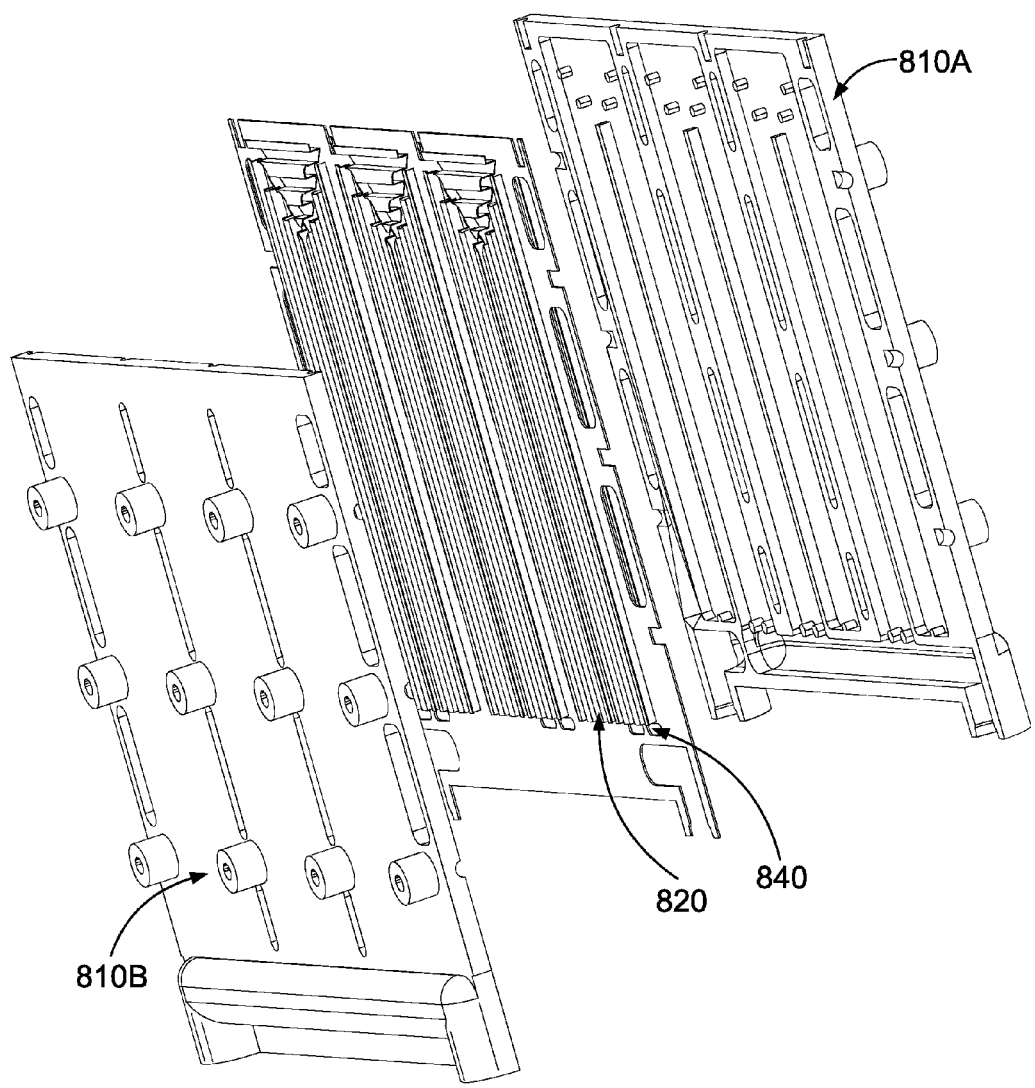
FIG. 10 is a perspective view of top and bottom layers of the liquid heat exchanger braze assembly of FIG. 9, according to an embodiment.

FIG. 10 is a perspective view of top and bottom layers of the liquid heat exchanger braze assembly 900 of FIG. 9, according to an embodiment. FIG. 10 is similar to FIG. 8, but illustrates how the liquid coolant flows between the two layers of the fins 820 on either side of the separator 830. The labeling of the top and bottom layers of the liquid heat exchanger braze assembly 900 should not be construed as limiting, because which layers of the liquid heat exchanger braze assembly 900 are considered top and bottom layers is arbitrary, and may be different in other embodiments. For convenience of description herein, the top layer is considered to be on the side of the liquid heat exchanger enclosure 810A.

Coolant may initially flow into the liquid heat exchanger 130, through three sets of the top layer of fins 820, then through the three sets of holes 840 in the separator 830 into the bottom layer of three sets of fins 820, and out of the liquid heat exchanger 130 after flowing through the bottom layer of fins 820. While three sets of fins 820 are shown, this should not be construed as limiting, as any number of sets of fins 820 may be provided in various embodiments. For example, in various other embodiments, there may be one, two, four, five, six, seven, eight, nine, ten, or other number of sets of fins 820. Thus, there may be any number of pairs of upper circulation paths and lower circulation paths guided by the sets of fins 820 disposed in parallel with one another.

Figure 11:
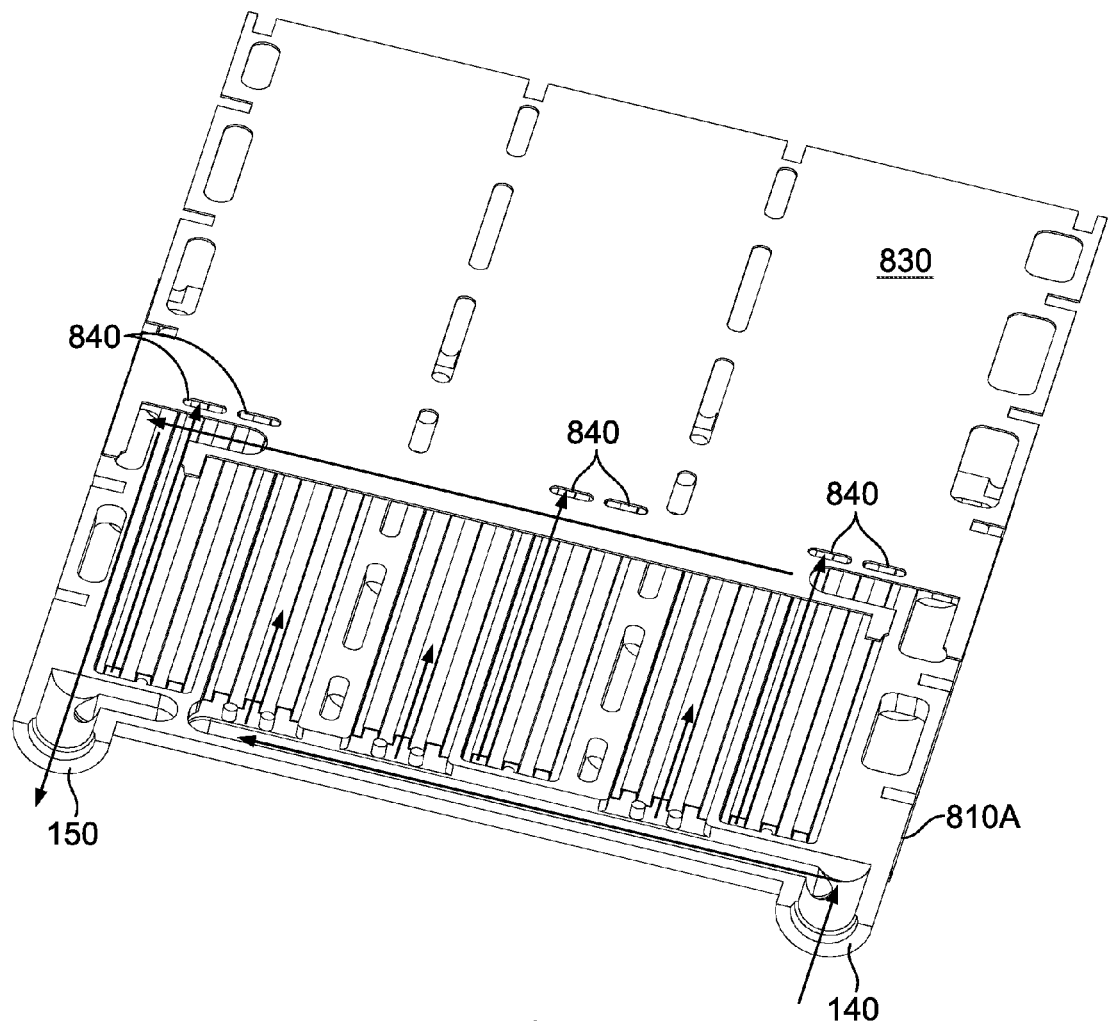
FIG. 11 is a perspective view of a top layer heat exchanger liquid circulation of the liquid heat exchanger braze assembly of FIG. 9, according to an embodiment.
Figure 12:
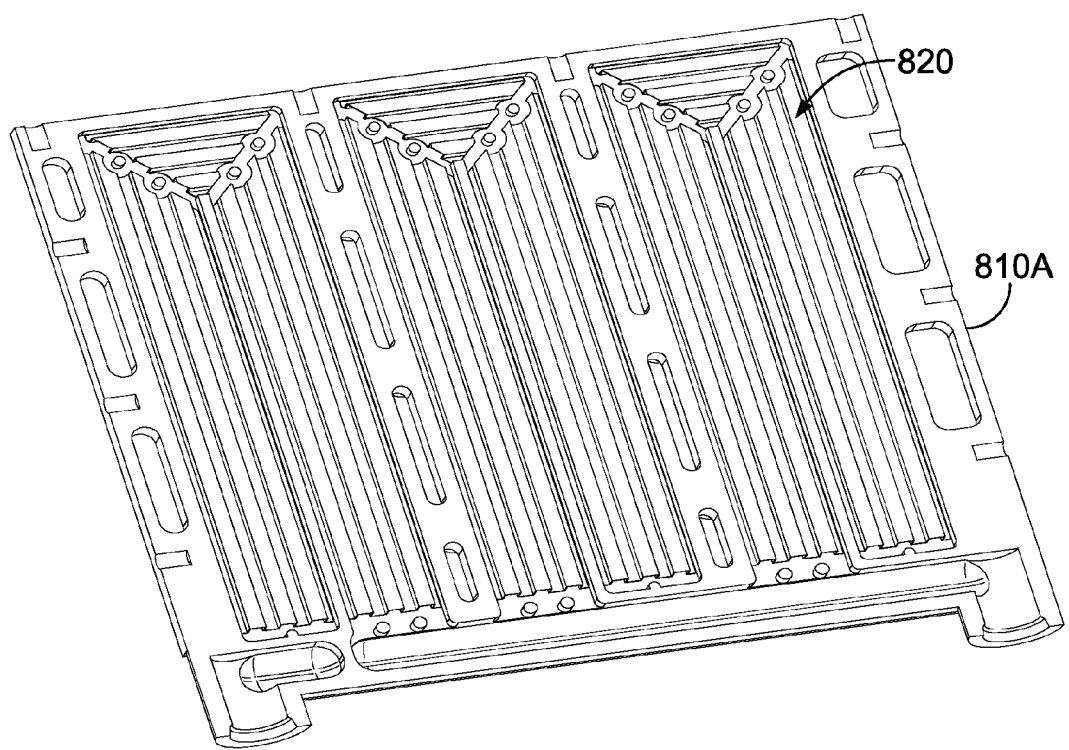
FIG. 12 is another perspective view of a top layer heat exchanger liquid circulation of the liquid heat exchanger braze assembly of FIG. 9, according to an embodiment.

FIG. 11 is a perspective view of a top layer heat exchanger liquid circulation of the liquid heat exchanger braze assembly 900 of FIG. 9, according to an embodiment. FIG. 12 is another perspective view of a top layer heat exchanger liquid circulation of the liquid heat exchanger braze assembly 900 of FIG. 9, according to an embodiment. FIG. 12 is similar to FIG. 11, except that FIG. 12 does not illustrate the separator 830. FIG. 10 further elaborates on the liquid circulation of the liquid coolant in the liquid heat exchanger braze assembly 900. The liquid coolant first flows through the liquid inlet port 140. Then, the liquid coolant flows in parallel into each set of the three sets of fins 820 in the top layer of the liquid heat exchanger 130. The horseshoe shaped sets of fins 820 form a serpentine pattern through which the liquid coolant flows. After flowing through each of the horseshoe shaped sets of fins 820, the liquid coolant flows through a respective set of holes 840 in the separator 830 into the respective horseshoe shaped sets of fins 820 on the bottom layer of the liquid heat exchanger 130. After flowing in parallel through the horseshoe shaped sets of fins 820 on the bottom layer of the liquid heat exchanger 130, the liquid coolant from all horseshoe shaped sets of fins 820 combines and exits the liquid heat exchanger 130 through the liquid outlet port 150. Thus, the liquid coolant flows in a serpentine path.

The liquid circulation path illustrated provides significant performance advantages over a conventional serpentine flow path in series. In a conventional serpentine flow path in series, coolant temperature rises in the direction toward the liquid outlet port. The thermoelectric modules' electrical resistance changes with temperature progressively in conventional systems, and this results in each thermoelectric module having a different performance compared to the other thermoelectric modules. In contrast, the parallel liquid circulation in the illustrated embodiments provides a counter-flow arrangement that increases heat transfer between the top and bottom layers of fins 820 and causes the coolant temperature to be more uniform between the liquid inlet port 140 and liquid outlet port 150. The counter-flow arrangement is characterized by the liquid coolant flowing in a substantially opposite direction in the layer of fins 820 on the upper side of the separator 830 than in the adjacent layer of fins 820 on the lower side of the separator 830. In other words, the upper circulation path guides the liquid coolant to flow in one direction alongside the upper side of the separator 830 at a given planar coordinate and the lower circulation path guides the liquid coolant to flow in a substantially opposite direction alongside the lower side of the separator 830 at the same given planar coordinate. This counter-flow arrangement minimizes liquid heat exchanger 130 surface temperature gradients across the thermoelectric modules 610. Thus, the performance of all thermoelectric modules 610 may be closer to one another than in conventional systems.

Figure 13:
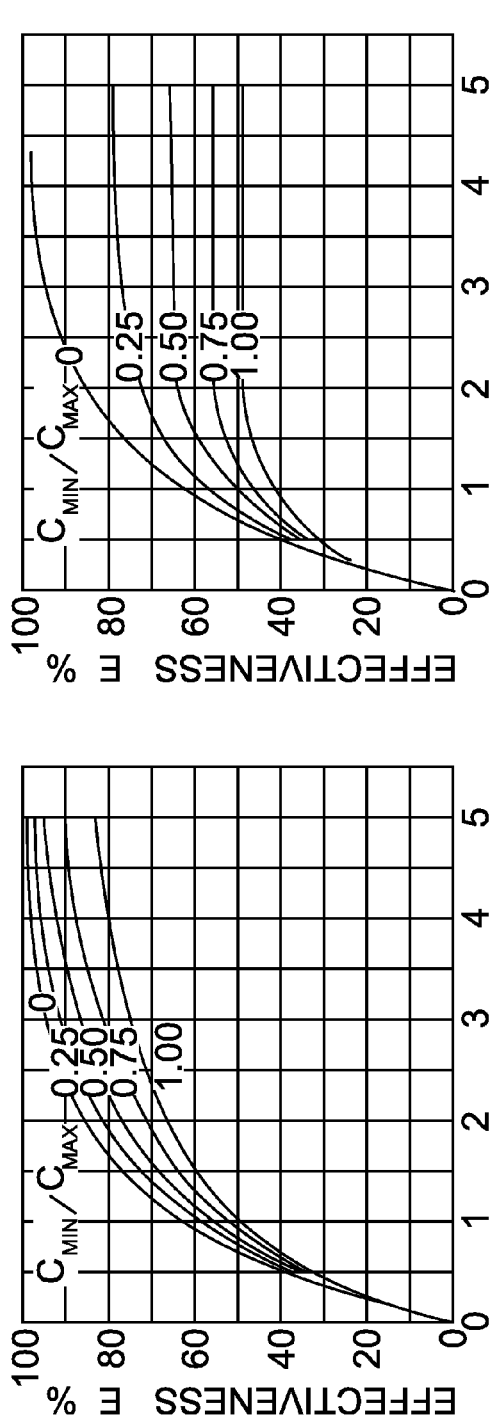
FIG. 13 illustrates a comparison of heat transfer effectiveness, according to an embodiment.

FIG. 13 illustrates a comparison of heat transfer effectiveness for a counterflow heat exchanger compared to a parallel-flow heat exchanger, according to an embodiment. A counterflow exchanger is one in which the flow of fluid on one side of a heat transfer surface is in a substantially opposite direction from that on the other side of the heat transfer surface. In contrast, a parallel-flow exchanger is one in which the flow of fluid on one side of a heat transfer surface is in the same direction as that on the other side of the heat transfer surface. The graph on the left illustrates that the heat transfer effectiveness for a counterflow exchanger as a function of a number of transfer units ($N_{Tu}=AU/C_{min}$) and capacity rate ratio in a counterflow heat exchanger has an effectiveness of about 90% at 5 transfer units with $C_{min}/C_{max}=0.75$. In contrast, the graph on the right illustrates that the heat transfer effectiveness for a parallel-flow exchanger as a function of a number of transfer units ($N_{Tu}=AU/C_{min}$) and capacity rate ratio in a parallel flow heat exchanger has an effectiveness of about 57% at 5 transfer units with $C_{min}/C_{max}=0.75$. The design of the embodiments in which liquid coolant flow through the fins 820 on one side of the separator 830 in the liquid heat exchanger 130 is in a substantially opposite direction of liquid coolant flow through the fins 820 on the opposite side of the separator 830 is therefore more efficient at transferring heat across the separator 830 than a design in which the flows are in parallel with one another by about 33%. As a result, the embodiments are more efficient in minimizing a temperature gradient across the entire surface of the sides of the liquid heat exchanger 130 to which the thermoelectric modules 610 are attached.

FIG. 14 illustrates an increase in heat transfer by applying thermoelectric modules 610 to both sides of a liquid heat exchanger 130, according to an embodiment. The table illustrates laminar-flow heat transfer and friction solutions for fully developed velocity and temperature profiles. In a conventional system where a thermoelectric module is only applied on a single side of a liquid heat exchanger, a value of N may only about 5.385. In contrast, when a thermoelectric module 610 is applied on both sides of a liquid heat exchanger 130, as in the embodiments described herein, a value of N may be about 8.235. Thus, heat transfer is increased by about 53% by having thermoelectric modules 610 applied on both sides of a liquid heat exchanger 130 as in the embodiments described herein compared to conventional thermoelectric heat transfer systems.

Figure 15:
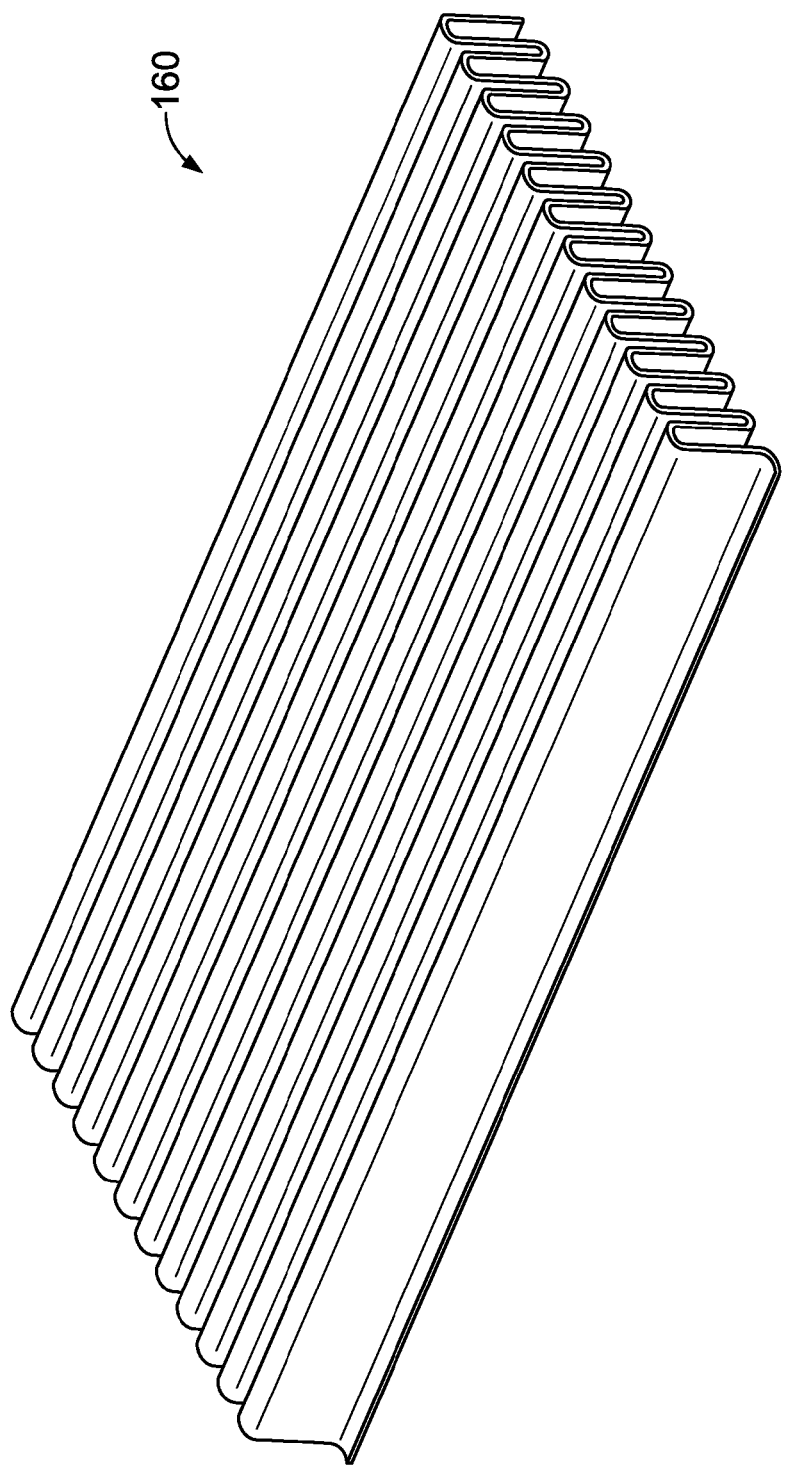
FIG. 15 is a perspective view of a straight fin of the of the air heat exchanger of the thermoelectric chiller assembly of FIG. 5, according to an embodiment.

FIG. 15 illustrates a straight fin 160 of the air heat exchangers 110A and 110B of the thermoelectric chiller assembly of FIGS. 5A and 5B, according to an embodiment. The straight fin design enhances thermal conductance between the air flowing through the fins 160 and the air heat exchangers 110A and 110B. The increased thermal conductance minimizes a temperature difference across the thermoelectric modules' surfaces facing the straight fins 160 and increases efficiency of the thermoelectric cooling device.

Figure 16:
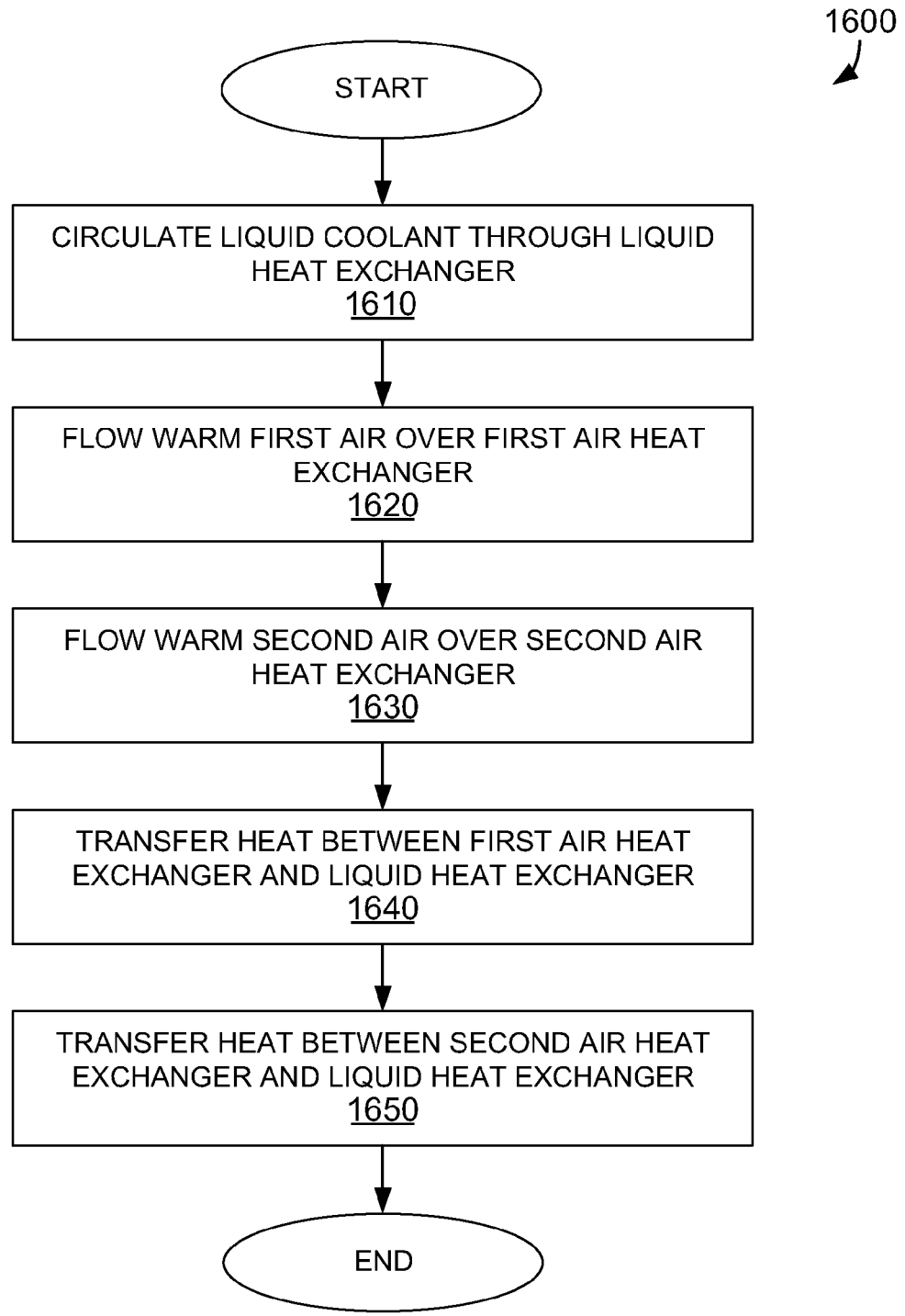
FIG. 16 illustrates a method of chilling air using a thermoelectric cooling device, according to an embodiment.

FIG. 16 illustrates a method 1600 of chilling air using a thermoelectric cooling device, according to an embodiment. The thermoelectric cooling device may include a liquid heat exchanger that has a liquid circulation path through which liquid coolant flows. The thermoelectric cooling device may also include two air heat exchangers, one on either side of the liquid heat exchanger, with a thermoelectric module thermally coupling each air heat exchanger with the liquid heat exchanger. The thermoelectric chiller assembly 100 is an embodiment of the thermoelectric cooling device.

At block 1610, liquid coolant circulates through the liquid heat exchanger. As the liquid coolant circulates, the liquid coolant exchanges heat with the liquid heat exchanger to cool the liquid heat exchanger. The liquid coolant may be pumped through a liquid coolant circulation system, such as onboard on aircraft, and through the liquid heat exchanger when coupled with the liquid coolant circulation system. The liquid coolant may be chilled by the liquid coolant circulation system, for example by a vapor cycle system incorporated with the liquid coolant circulation system, and thereby cool the liquid heat exchanger by absorbing heat from the liquid heat exchanger. The liquid coolant may be cooler than the liquid heat exchanger.

At block 1620, warm air flows over a first of the two air heat exchangers on either side of the liquid heat exchanger. The warm air may come from an interior of a chilled compartment, for example the chilled compartment 220. The warm air may be warmer than the air heat exchanger, yet cooler than an ambient temperature surrounding a compartment chiller that incorporates the thermoelectric cooling device. The air heat exchanger may cool the warm air that flows over the air heat exchanger. In an embodiment, the warm air may flow over thermally conductive fins that enhance thermal conductance between the warm air and the heat exchanger. Fins 160 may be embodiments of the thermally conductive fins. The cooled air may then return to the interior of the chilled compartment, and thereby cool the interior of the chilled compartment.

At block 1630, warm air flows over a second of the two air heat exchangers on either side of the liquid heat exchanger. The construction and operation of the second of the two air heat exchangers may be similar to that of the first air heat exchanger. Therefore, the process of block 1630 may be substantially similar to that of block 1620.

At block 1640, heat is transferred between the first air heat exchanger and the liquid heat exchanger to cool the first air heat exchanger. The heat may be transferred using a thermoelectric device (TED) which operates according to the Peltier effect. The thermoelectric modules 610 may be embodiments of the TEDs which transfer heat between the first air heat exchanger and the liquid heat exchanger. The TEDs may cool the first air heat exchanger by transferring heat from the first air heat exchanger to the liquid heat exchanger. The liquid heat exchanger is then cooled by transferring heat to the liquid coolant as discussed at block 1610.

At block 1650, heat is transferred between the second air heat exchanger and the liquid heat exchanger to cool the second air heat exchanger. Because the construction and operation of the second air heat exchanger may be substantially similar to that of the first air heat exchanger, the process of block 1650 may be substantially similar to that of block 1640.

All references, including publications, patent applications, and patents, cited herein are hereby incorporated by reference to the same extent as if each reference were individually and specifically indicated to be incorporated by reference and were set forth in its entirety herein.

For the purposes of promoting an understanding of the principles of the invention, reference has been made to the embodiments illustrated in the drawings, and specific language has been used to describe these embodiments. However, no limitation of the scope of the invention is intended by this specific language, and the invention should be construed to encompass all embodiments that would normally occur to one of ordinary skill in the art. The terminology used herein is for the purpose of describing the particular embodiments and is not intended to be limiting of exemplary embodiments of the invention. In the description of the embodiments, certain detailed explanations of related art are omitted when it is deemed that they may unnecessarily obscure the essence of the invention.

The use of any and all examples, or exemplary language (e.g., "such as") provided herein, is intended merely to better illuminate the invention and does not pose a limitation on the scope of the invention unless otherwise claimed. Numerous modifications and adaptations will be readily apparent to those of ordinary skill in this art without departing from the spirit and scope of the invention as defined by the following claims. Therefore, the scope of the invention is defined not by the detailed description of the invention but by the following claims, and all differences within the scope will be construed as being included in the invention.

No item or component is essential to the practice of the invention unless the element is specifically described as "essential" or "critical". It will also be recognized that the terms "comprises," "comprising," "includes," "including," "has," and "having," as used herein, are specifically intended to be read as open-ended terms of art. The use of the terms "a" and "an" and "the" and similar referents in the context of describing the invention (especially in the context of the following claims) are to be construed to cover both the singular and the plural, unless the context clearly indicates otherwise. In addition, it should be understood that although the terms "first," "second," etc. may be used herein to describe various elements, these elements should not be limited by these terms, which are only used to distinguish one element from another. Furthermore, recitation of ranges of values herein are merely intended to serve as a shorthand method of referring individually to each separate value falling within the range, unless otherwise indicated herein, and each separate value is incorporated into the specification as if it were individually recited herein.

What is claimed is:

1. A thermoelectric cooling device comprising:
a liquid heat exchanger including a separator that separates a liquid circulation path into an upper circulation path and a lower circulation path, upper fins adjacent the separator on one side of the separator, and lower fins adjacent the separator on an opposite side of the separator, the upper fins guiding liquid coolant along the upper circulation path at a given planar coordinate alongside the one side of the separator to flow in one direction and the lower fins guiding the liquid coolant along the lower circulation path at the same given planar coordinate alongside the opposite side of the separator to flow in a substantially opposite direction, the liquid heat exchanger configured to exchange heat with the liquid coolant that flows through the liquid heat exchanger;
a first air heat exchanger, the first air heat exchanger configured to exchange heat with air that flows over the first air heat exchanger;
a second air heat exchanger, the second air heat exchanger configured to exchange heat with air that flows over the second air heat exchanger;
a first thermoelectric module thermally coupled on a first side of the first thermoelectric module with a first side of the liquid heat exchanger and on a second side of the first thermoelectric module with the first air heat exchanger to transfer heat between the first air heat exchanger and the liquid heat exchanger; and
a second thermoelectric module thermally coupled on a first side of the second thermoelectric module with a second side of the liquid heat exchanger and on a second side of the second thermoelectric module with the second air heat exchanger to transfer heat between the second air heat exchanger and the liquid heat exchanger.

2. The thermoelectric cooling device of claim 1, the first air heat exchanger including thermally conductive fins that enhance thermal conductance between the first air heat exchanger and the air that flows over the first air heat exchanger.

3. The thermoelectric cooling device of claim 1, the liquid heat exchanger including an inlet and an outlet, the liquid heat exchanger configured to receive the liquid coolant from outside the liquid heat exchanger through the inlet into the upper circulation path and output the liquid coolant from the lower circulation path through the outlet to outside the liquid heat exchanger, wherein the separator is configured to pass the liquid coolant through a hole from the upper circulation path to the lower circulation path.

4. The thermoelectric cooling device of claim 1, the upper fins and the lower fins arranged in a serpentine pattern that guides the liquid coolant in the upper circulation path and the liquid coolant in the lower circulation path to flow in substantially opposite directions from one another along opposite sides of the separator.

5. The thermoelectric cooling device of claim 1, the liquid circulation path being separated into a plurality of pairs of upper circulation paths and lower circulation paths disposed in parallel with one another.

6. A compartment chiller comprising:
a housing;
a chilled compartment disposed within the housing;
a liquid heat exchanger including a separator that separates a liquid circulation path into an upper circulation path and a lower circulation path, upper fins adjacent the separator on one side of the separator, and lower fins adjacent the separator on an opposite side of the separator, the upper fins guiding liquid coolant along the upper circulation path at a given planar coordinate alongside the one side of the separator to flow in one direction and the lower fins guiding the liquid coolant along the lower circulation path at the same given planar coordinate alongside the opposite side of the separator to flow in a substantially opposite direction, the liquid heat exchanger configured to exchange heat with liquid coolant that flows through the liquid heat exchanger;
a first air heat exchanger, the first air heat exchanger configured to exchange heat with air that flows over the first air heat exchanger before chilling the chilled compartment;
a second air heat exchanger, the second air heat exchanger configured to exchange heat with air that flows over the second air heat exchanger before chilling the chilled compartment;
a first thermoelectric module thermally coupled on a first side of the first thermoelectric module with a first side of the liquid heat exchanger and on a second side of the first thermoelectric module with the first air heat exchanger to transfer heat between the first air heat exchanger and the liquid heat exchanger; and
a second thermoelectric module thermally coupled on a first side of the second thermoelectric module with a second side of the liquid heat exchanger and on a second side of the second thermoelectric module with the second air heat exchanger to transfer heat between the second air heat exchanger and the liquid heat exchanger.

7. The compartment chiller of claim 6, the first air heat exchanger including thermally conductive fins that enhance thermal conductance between the first air heat exchanger and the air that flows over the first air heat exchanger.

8. The compartment chiller of claim 6, the liquid heat exchanger including an inlet and an outlet, the liquid heat exchanger configured to receive the liquid coolant from outside the liquid heat exchanger through the inlet into the upper circulation path and output the liquid coolant from the lower circulation path through the outlet to outside the liquid heat exchanger, wherein the separator is configured to pass the liquid coolant through a hole from the upper circulation path to the lower circulation path.

9. The compartment chiller of claim 6, the upper fins and the lower fins arranged in a serpentine pattern that guides the liquid coolant in the upper circulation path and the liquid coolant in the lower circulation path to flow in substantially opposite directions from one another along opposite sides of the separator.

10. The compartment chiller of claim 6, the liquid circulation path being separated into a plurality of pairs of upper circulation paths and lower circulation paths disposed in parallel with one another.

11. A method of chilling air using a thermoelectric cooling device comprising a liquid heat exchanger including a liquid circulation path, a first air heat exchanger, a second air heat exchanger, a first thermoelectric module thermally coupled on a first side of the first thermoelectric module with a first side of the liquid heat exchanger and on a second side of the first thermoelectric module with the first air heat exchanger, and a second thermoelectric module thermally coupled on a first side of the second thermoelectric module with a second side of the liquid heat exchanger and on a second side of the second thermoelectric module with the second air heat exchanger, the method comprising:
separating the liquid circulation path into an upper circulation path and a lower circulation path using a separator, the upper circulation path guiding the liquid coolant at a given planar coordinate alongside one side of the separator to flow in one direction using upper fins and the lower circulation path guiding the liquid coolant at the same given planar coordinate alongside the opposite side of the separator to flow in a substantially opposite direction using lower fins, the upper fins and the lower fins arranged in a serpentine pattern, circulating liquid coolant through the liquid heat exchanger to exchange heat with the liquid heat exchanger to cool the liquid heat exchanger, the liquid coolant entering the upper circulation path from outside the liquid heat exchanger through an inlet, the liquid coolant exiting the lower circulation path to outside the liquid heat exchanger through an outlet, and the liquid coolant passing through a hole in the separator from the upper circulation path to the lower circulation path, flowing warm first air over the first air heat exchanger to exchange heat with the first air heat exchanger to cool the first air;

flowing warm second air over the second air heat exchanger to exchange heat with the second air heat exchanger to cool the second air;

transferring heat between the first air heat exchanger and the liquid heat exchanger to cool the first air heat exchanger; and transferring heat between the second air heat exchanger and the liquid heat exchanger to cool the second air heat exchanger.

12. The method of claim 11, further comprising flowing the warm first air over thermally conductive fins that enhance thermal conductance between the warm first air and the first air heat exchanger.

13. The method of claim 11, further comprising guiding the liquid coolant in a plurality of pairs of upper circulation paths and lower circulation paths disposed in parallel with one another.

14. A thermoelectric cooling device comprising:
a liquid heat exchanger configured to exchange heat with liquid coolant that flows through the liquid heat exchanger, the liquid heat exchanger including:
an inlet that receives the liquid coolant from outside the liquid heat exchanger;
an outlet that outputs the liquid coolant to outside the liquid heat exchanger; and
a separator oriented along a plane parallel to both a first side and a second side of the liquid heat exchanger, the separator configured to separate a liquid circulation path within the liquid heat exchanger between the inlet and the outlet into an upper circulation path and a lower circulation path, the upper circulation path configured to guide the liquid coolant at a given planar coordinate alongside one side of the separator to flow in one direction, and the lower circulation path configured to guide the liquid coolant at the same given planar coordinate alongside an opposite side of the separator to flow in a substantially opposite direction relative to the one direction;
a first air heat exchanger configured to exchange heat with air that flows over the first air heat exchanger;
a second air heat exchanger configured to exchange heat with air that flows over the second air heat exchanger;
a first thermoelectric module thermally coupled on a first side of the first thermoelectric module with the first side of the liquid heat exchanger and thermally coupled on a second side of the first thermoelectric module with the first air heat exchanger to transfer heat between the first air heat exchanger and the liquid heat exchanger; and a second thermoelectric module thermally coupled on a first side of the second thermoelectric module with the second side of the liquid heat exchanger and thermally coupled on a second side of the second thermoelectric module with the second air heat exchanger to transfer heat between the second air heat exchanger and the liquid heat exchanger.

15. The thermoelectric cooling device of claim 14, wherein the liquid coolant flows sequentially from the inlet into a first end of the upper circulation path, through the upper circulation path to a second end of the upper circulation path, through a passage in the separator at the second end of the upper circulation path into a first end of the lower circulation path, through the lower circulation path to a second end of the lower circulation path, and from the second end of the lower circulation path out through the outlet.

16. The thermoelectric cooling device of claim 14, the first air heat exchanger including thermally conductive fins that enhance thermal conductance between the first air heat exchanger and the air that flows over the first air heat exchanger.

17. The thermoelectric cooling device of claim 14, the upper circulation path including upper fins adjacent the separator on the one side of the separator, and the lower circulation path including lower fins adjacent the separator on the opposite side of the separator, the upper fins guiding a path of the upper circulation path and the lower fins guiding a path of the lower circulation path.

18. The thermoelectric cooling device of claim 14, the upper circulation path and the lower circulation path each guiding the liquid coolant to flow in a serpentine path in substantially opposite directions from one another.

19. The thermoelectric cooling device of claim 14, the liquid circulation path being separated into a plurality of pairs of upper circulation paths and lower circulation paths disposed in parallel with one another.

20. The thermoelectric cooling device of claim 14, further comprising:
a housing; and
a chilled compartment disposed within the housing, the chilled compartment in fluid communication with the first air heat exchanger and the second air heat exchanger to receive the air chilled by the first air heat exchanger and the second air heat exchanger.

21. A method of chilling air using a thermoelectric cooling device comprising a liquid heat exchanger including a liquid circulation path, a first air heat exchanger, a second air heat exchanger, a first thermoelectric module thermally coupled on a first side of the first thermoelectric module with a first side of the liquid heat exchanger and on a second side of the first thermoelectric module with the first air heat exchanger, and a second thermoelectric module thermally coupled on a first side of the second thermoelectric module with a second side of the liquid heat exchanger and on a second side of the second thermoelectric module with the second air heat exchanger, the method comprising:
receiving liquid coolant from outside the liquid heat exchanger through an inlet into a liquid circulation path of the liquid heat exchanger;
guiding the liquid coolant along an upper circulation path alongside one side of a separator oriented along a plane parallel to both the first side and the second side of the liquid heat exchanger, the liquid coolant in the upper circulation path flowing in one direction at a given planar coordinate alongside the one side of the separator;
guiding the liquid coolant along a lower circulation path alongside an opposite side of the separator, the liquid coolant in the lower circulation path flowing in a substantially opposite direction relative to the one direction at the same given planar coordinate alongside the opposite side of the separator;

outputting the liquid coolant from the liquid circulation path of the liquid heat exchanger through an outlet to outside the liquid heat exchanger;

transferring heat between the first air heat exchanger and the liquid heat exchanger to cool the first air heat exchanger using the first thermoelectric module;

transferring heat between the second air heat exchanger and the liquid heat exchanger to cool the second air heat exchanger using the second thermoelectric module;

flowing first air over the first air heat exchanger to exchange heat with the first air heat exchanger to cool the first air; and flowing second air over the second air heat exchanger to exchange heat with the second air heat exchanger to cool the second air.

22. The method of claim 21, wherein the liquid coolant flows sequentially from the inlet into a first end of the upper circulation path, through the upper circulation path to a second end of the upper circulation path, through a passage in the separator at the second end of the upper circulation path into a first end of the lower circulation path, through the lower circulation path to a second end of the lower circulation path, and from the second end of the lower circulation path out through the outlet.

* * * * *